(12) United States Patent
Kulach et al.

(10) Patent No.: US 8,330,236 B2
(45) Date of Patent: Dec. 11, 2012

(54) ISOLATION CHANNEL IMPROVING MEASUREMENT ACCURACY OF MEMS DEVICES

(75) Inventors: Christopher J. Kulach, Calgary (CA); Paul R. MacDonald, Calgary (CA)

(73) Assignee: Garmin Switzerland GmbH (CH)

( * ) Notice: Subject to any disclaimer, the term of this patent is extended or adjusted under 35 U.S.C. 154(b) by 1114 days.

(21) Appl. No.: 12/235,778

(22) Filed: Sep. 23, 2008

(65) Prior Publication Data
US 2009/0315127 A1 Dec. 24, 2009

Related U.S. Application Data

(60) Provisional application No. 61/074,307, filed on Jun. 20, 2008.

(51) Int. Cl.
*H01L 29/84* (2006.01)
(52) U.S. Cl. .. 257/415; 257/416; 257/659; 257/E23.189
(58) Field of Classification Search .......... 257/415–418, 257/629
See application file for complete search history.

(56) References Cited

U.S. PATENT DOCUMENTS

| 7,202,552 | B2 | 4/2007 | Zhe et al. ......................... 57/659 |
| 2006/0085825 | A1 | 4/2006 | Istvan et al. ...................... 725/86 |
| 2006/0090929 | A1* | 5/2006 | Chao et al. ..................... 174/255 |
| 2006/0090930 | A1* | 5/2006 | Chao et al. ..................... 174/255 |

OTHER PUBLICATIONS

Geitner, Hubert; Considerations for Soldering Accelerometers in LCC-8 Packages onto Printed Circuit Boards; Analog Devices, Inc.; 2003.
Gogoi, Bishnu, Ph.D., Challenges in Packaging for MEMS devices; Motorola, Oct. 2003.
Tuck, Kimberly, et al; Soldering and Mounting Guidelines for the LGA Accelerometer Sensor to a PC Board; Freescale Semiconductor; 2007.

* cited by examiner

*Primary Examiner* — Dung A. Le
(74) *Attorney, Agent, or Firm* — Samuel M. Korte; Mohammad M. Ali

(57) ABSTRACT

A system for improving the performance of a microelectromechanical systems (MEMS) device that is housed in a package and implemented on a printed circuit board (PCB) comprises a footprint, an isolation channel, and a bridge. A portion of the isolation channel is removed to mechanically isolate the MEMS device.

10 Claims, 3 Drawing Sheets

ISOLATION CHANNEL IMPROVING MEASUREMENT ACCURACY OF MEMS DEVICES

RELATED APPLICATIONS

This nonprovisional patent application claims priority benefit, with regard to all common subject matter, of earlier-filed U.S. provisional patent application titled "Method and Apparatus for Improving Measurement Accuracy of MEMS Devices," Ser. No. 61/074,307, filed Jun. 20, 2008, hereby incorporated by reference in its entirety into the present application.

BACKGROUND OF THE INVENTION

Embodiments of the present invention relate to microelectromechanical systems (MEMS) devices. More particularly, embodiments of the present invention relate to packaged MEMS devices attached to a printed circuit board (PCB).

MEMS devices are widely employed in electrical and electronic systems to perform a variety of tasks. MEMS devices often include small mechanical structures, and thus the devices are generally enclosed in a protective package in order to be reliably utilized in a system. The package includes electrical connectors, such as leads, pins, balls, or lands, attached to the external surface of the package that offer communication between the MEMS device and the system. Typically, installation in a system involves mounting the package on a PCB such that the electrical connectors of the package contact electrically conductive pads or holes on the PCB. The package connectors are typically coupled to the PCB conductors with solder, a flowable usually metallic material.

While the primary purpose for using solder to couple package connectors to PCB conductors is to provide a highly-reliable, low-resistance electrical connection between the connectors and the conductors, solder also provides a relatively strong mechanical connection between the connectors and the conductors, and in turn, the MEMS device package and the PCB. With a strong mechanical connection between the package and the PCB, mechanical stresses and deformations of the PCB can be transferred to the MEMS device package. Similarly, thermal stresses on the PCB may also be transferred to the MEMS device package. Overall, MEMS devices are sensitive to package stress. MEMS devices enclosed in non-hermetic plastic packages are particularly sensitive to mechanical stress. For example, MEMS devices that provide measurements, such as accelerometers or pressure sensors, may provide erroneous readings when under stress. To correct these errors, frequent calibration must be performed or compensation algorithms may have to be employed. Furthermore, it is possible that the accuracy of MEMS accelerometers may suffer even after the stress on the package is removed. Therefore, traditional techniques to implement a packaged MEMS device on a PCB may lead to poor performance of the MEMS device that requires calibration or compensation techniques or results in degraded system performance.

SUMMARY OF THE INVENTION

Embodiments of the present invention solve the above-mentioned problems and provide a distinct advance in the art of microelectromechanical systems (MEMS) devices. More particularly, embodiments of the invention provide a system and method for improving the performance of a packaged MEMS device that is implemented on a printed circuit board (PCB).

In various embodiments of the present invention, the system comprises at least two PCB regions, one or more isolation channels, one or more bridges, and a footprint. The two PCB regions are substantially mechanically isolated from each other by one or more isolation channels, and are connected to each other by one or more bridges. The first PCB region contains at least the footprint for a MEMS device and the second PCB region contains at least one potential stress source. The stress source may be, for example, an enclosure contact point or a component expected to generate substantial amount of heat. The MEMS device footprint may include a plurality of conductive pads or holes on the surface or through the body of the PCB and is operable to receive the MEMS device package. The isolation channel is a region of the PCB that excludes components and traces. A portion of the isolation channel is removed to mechanically isolate the first PCB region from the second PCB region. The one or more bridges connects the first PCB region to the second PCB region and may include a PCB portion or another mechanical element such as a cable or connector spanning the isolation channel.

In various other embodiments of the present invention, the method comprises providing a footprint for a MEMS device within a first region of the PCB and including an isolation channel located adjacent to the first region in which components and traces are excluded to allow for removal of printed circuit board material. The method provides a bridge located adjacent to the isolation channel to mechanically connect the first region of the PCB with other regions of the PCB, and coupling components in the first region of the PCB to components external to the first region of the PCB. The method further includes removing a portion of the PCB material located within the isolation channel and attaching the MEMS device to the footprint.

This summary is provided to introduce a selection of concepts in a simplified form that are further described below in the detailed description. This summary is not intended to identify key features or essential features of the claimed subject matter, nor is it intended to be used to limit the scope of the claimed subject matter.

Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 1 is a plan view of a system for improving the performance of a microelectromechanical systems (MEMS) device that is housed in a package and implemented on a printed circuit board (PCB), constructed in accordance with various embodiments of the present invention, depicting the packaged MEMS device before attachment to the PCB and an isolation channel before removal of a portion of the PCB material within the isolation channel;

Figure 1:
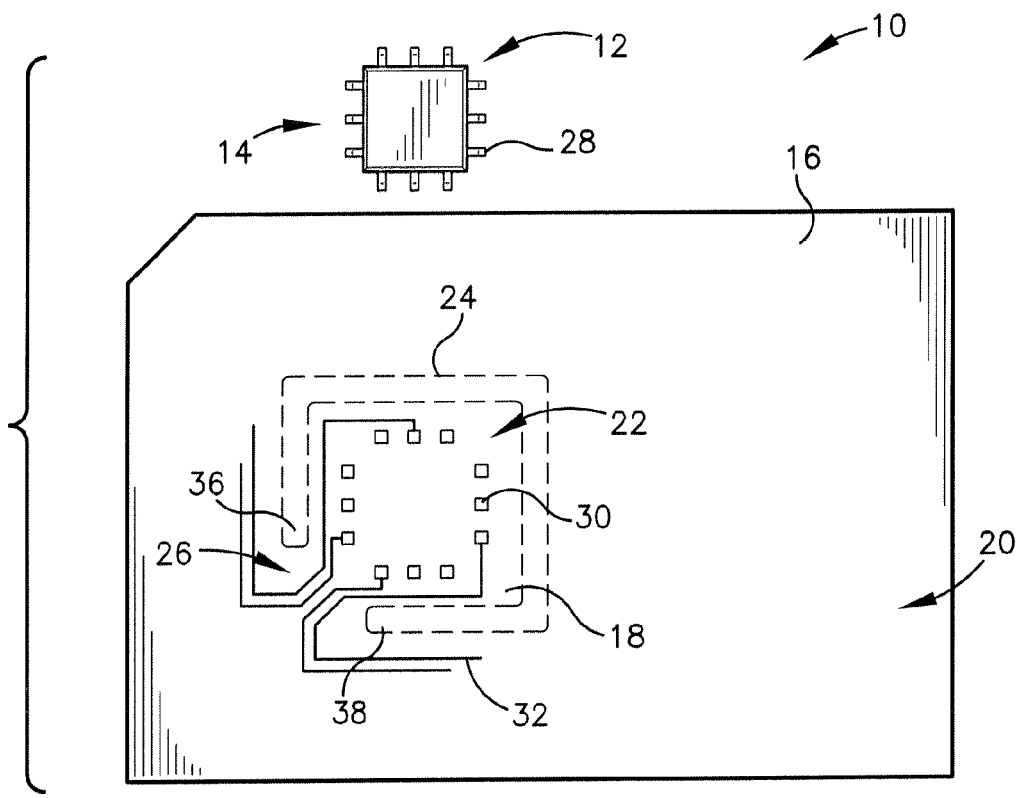

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 2:
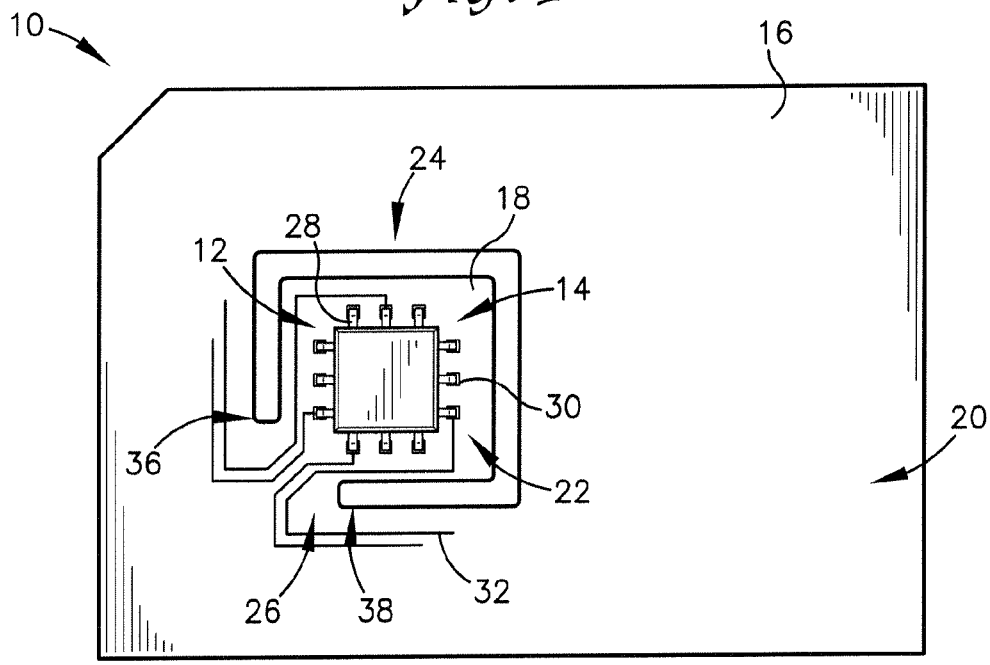
FIG. 2 is a plan view of the system depicting the packaged MEMS device after attachment to the PCB and the isolation channel after a portion of the PCB material within the isolation channel has been removed.

A system 10, constructed in accordance with various embodiments of the present invention, for improving the performance of a microelectromechanical systems (MEMS) device 12 that is housed in a package 14 and implemented on a printed circuit board (PCB) 16 is shown in FIGS. 1 and 2. The system 10 comprises a first region 18 of the PCB 16, a second region 20 of the PCB 16, a footprint 22, an isolation channel 24, and a bridge 26.

The MEMS device 12 may be in general any device that includes small scale mechanical structures. For example, the MEMS device 12 may have movable components or other mechanical structures with dimensions in the range of 1-10 micrometers or less. These devices may include motors or other moving parts and may perform functions such as actuating or sensing. In particular, the MEMS device 12 may be an accelerometer used to measure acceleration. The MEMS device 12 may be implemented using materials such as silicon, polymers, or metals, and may be manufactured utilizing standard electronics processing techniques, including deposition, photolithography, etching, micromachining, and the like.

The MEMS device 12 in general, and a MEMS accelerometer in particular, may be implemented, utilized, or incorporated in any electronic device including stationary devices, hand-held devices or devices employed in mobile systems or vehicles. Examples of such devices include personal navigation devices, navigation-enabled mobile phones, personal digital assistants, satellite navigation receivers, gaming systems, or the like.

The MEMS device 12 may be without a package or may be packaged in any one of a variety of traditional electronics packages and MEMS packages. The package 14 may be hermetically sealed and may include a premolded cavity to prevent debris or moisture from contaminating the device 12 or otherwise diminishing its performance. The package 14 may also be a non-hermetic to minimize packaging cost and size. The package 14 may be manufactured from plastics, ceramics, or other insulating materials.

The package 14 may also include a plurality of electrically conductive connectors 28, such as leads, pins, balls, or lands, that are attached to the external surface of the package 14 and generally receive the inputs and outputs of the MEMS device 12. During implementation, the package connectors 28 may couple with one or more conductors 30 of the PCB 16. The package 14 may be implemented in a variety of configurations that interface with the PCB 16 either in a through-hole fashion or a surface-mount fashion. The through-hole approach involves inserting pins or leads from the package 14 through electrically conductive, plated holes in the PCB 16 and soldering the pins to the plated holes, as is known in the art. Surface-mount packages usually include connectors 28, such as leads, balls, or lands, that couple to conductive pads 30 on the surface of one side or the other of the PCB 16. The package connectors 28 are soldered to the PCB conductors 30 using techniques that are known in the art. Examples of the package 14 include, but are not limited to, dual-inline package (DIP), small-outline integrated circuit (SOIC), plastic leaded chip carrier (PLCC), leadless chip carrier (LCC), quad flat package (QFP), pin grid array (PGA), ball grid array (BGA), land grid array (LGA), thin land grid array (TLGA), and the like.

The PCB 16 generally provides a medium for the packaged MEMS device 12 and other electrical or electronic components to communicate through one or more electrically conductive traces 32 while being mechanically supported in proximity to one another. The PCB 16 may include one or more planar conductive layers, on which the traces 32 are located, with electrically insulating material included between the conductive layers, wherein the conductive material is primarily a metal, most often being copper. The PCB 16 may also include plated holes through the board as well as other features such as blind and buried vias, as are known in the art. The PCB 16 may be manufactured from insulating materials that are chosen for their properties, such as rigidity or stiffness, and dielectric strength. The materials may include cotton paper and epoxy, woven glass and epoxy (such as widely-known FR4), woven glass and ceramics, and the like.

The PCB 16 may be designed using conventional techniques wherein components are manually placed and the traces 32 between them are manually routed. Alternatively, the PCB 16 may be designed using computer-aided drafting (CAD) or electronic design automation (EDA) software programs that automatically place components and route the traces 32 between them given either a schematic of the circuit using schematic capture, or a coded description of the circuit using a hardware description language (HDL), such as VHDL or Verilog.

The first region 18 of the PCB 16 may include the footprint 22 in addition to a portion of the PCB 16 surrounding the footprint 22. The first region 18 may also include one or more traces, as well as one or more components. In various embodiments, the first region 18 may also include cable connectors or terminals to couple the system 10 to external components, devices, or systems. The size and the shape of the first region 18 may vary to accommodate the footprint 22, the traces 32, any components, and any other objects that are positioned within the first region 18.

The second region 20 of the PCB 16 may include any portion of the PCB 16 that is not included in the first region 18, the isolation channel 24, or the bridge 26. The second region 20 of the PCB 16 may include one or more components as well as one or more traces 32, cable connectors or terminals, mounting elements, and the like. The size and shape of the second region 20 may vary to accommodate the traces 32, any components, and any other objects that are positioned within the second region 20.

The footprint 22 is positioned on the PCB 16 and generally receives the packaged or unpackaged MEMS device 12 to provide electrical communication with other components on the PCB 16. The footprint 22 may include a plurality of electrical conductors 30 that correspond to the electrical connectors 28 of the package 14 or contact points on a silicon chip containing the MEMS device 12. For example, if the package 14 includes pins or leads that are to be inserted through the PCB 16, then the footprint 22 may include a plurality of plated holes to match the positions of the pins or leads. Alternatively, if the package 14 includes leads, balls, or lands that are surface mount, then the footprint 22 may include conductive pads 30 on the surface of one of the sides of the PCB 16 that matches the pattern of the connectors 28 on the package 14. If the MEMS device 12 is unpackaged, then the footprint 22 may include conductive pads 30 on the surface of one of the sides of the PCB 16 that are suitable in shape and proximity to the silicon chip containing the MEMS device 12 for wire bonding with techniques known in the art such as Chip on Board (COB). Each pad may be in the shape of a circle or rectangle to match the shape of the connector on the package 14. The footprint 22 may also include a package outline and a reference designator or other information that are printed on the surface of the PCB 16 to aid during the assembly process. In addition, while the footprint 22 typically includes four sides in a square or rectangular shape to match the shape of standard MEMS device packages, the number of sides of the footprint 22 may vary to match the number of sides of any electrical or electronic device package.

The isolation channel 24 generally allows for removal of a portion of the PCB 16 that surrounds the first region 18 of the PCB 16 containing the footprint 22. The isolation channel 24 is shown in dashed line in FIG. 1 before the removal of any PCB 16 material. FIG. 2 illustrates the isolation channel 24 after the removal of a significant portion of the PCB 16 material within the isolation channel 24. The isolation channel 24 may include an area around the first region 18 in which components are not placed and connections or traces 32 are not routed on any level or layer of the PCB 16. This restriction may be specified during the physical design of the PCB 16. The automated software tools may be directed to avoid one or more areas when placing components and routing between them, or during manual placement and routing, one or more areas may be avoided.

The isolation channel 24 may include an area that surrounds the first region 18 on at least one side of the first region 18. To provide maximum isolation from stress and deformation, the isolation channel 24 may surround at least a portion of all sides of the first region 18. For example, in the embodiment of the system 10 as shown in FIGS. 1 and 2, the isolation channel 24 completely surrounds two of the four sides of the first region 18, while surrounding a significant portion of the other two sides. Thus, a high percentage of the perimeter of the first region 18 is surrounded by the isolation channel 24. Generally, the isolation channel 24 surrounds a certain minimum portion of the first region 18 in order to provide a certain minimum amount of stress and deformation isolation. In one embodiment, the isolation channel 24 surrounds a minimum of 75% of the first region 18.

The isolation channel 24 may be generally elongated and may be oriented generally parallel to the sides of the footprint 22. The isolation channel may include a first end 36 and a second end 38. In one configuration, the first end 36 and the second end 38 of the isolation channel 24 are located near one corner of the footprint 22, as shown in FIGS. 1 and 2. Other configurations of the isolation channel 24 are possible, such as the first end 36 and the second end 38 being located along one side of the footprint 22, perhaps near the middle of the one side of the footprint 22.

In various other embodiments of the system 10, there may be more than one isolation channel 24 surrounding the first region 18. For example, there may be a first isolation channel that surrounds at least a portion of two sides of the first region 18, and a second isolation channel that surrounds at least a portion of the other two sides of the first region 18. The first isolation channel and the second isolation channel may be configured such that the first and second ends 36, 38 of each isolation channel 24 are located near opposing corners of the first region 18. Greater numbers of isolation channels 24 are provided with varying configurations of the isolation channel 24 in various embodiments of the present invention.

In other embodiments of the system 10, the isolation channel 24 may be partially created by utilizing existing PCB 16 edges. For example, if the footprint 22 is positioned on the PCB 16 near one of the PCB 16 corners, two edges of the isolation channel 24 may overlap with the two adjacent PCB 16 edges.

In various other embodiments of the system 10, the system 10 may include more than two regions that need to be isolated from one another. Accordingly, there may be one or more isolation channels 24 to mechanically isolate one or more regions of the PCB 16 from each other in order to prevent stresses and deformations present in one or more regions of the PCB 16 from being transferred to other regions of the PCB 16. For example, the PCB 16 may be designed to be attached to an enclosure in one or more PCB 16 regions. The isolation channel 24 may be designed to substantially surround only these regions of attachment to the enclosure to prevent any stresses or deflections resulting from enclosure attachments from being transferred to the PCB 16 region containing the MEMS device 12.

A portion of the PCB 16 material within the isolation channel 24 may be removed in order to provide mechanical isolation between the first region 18 of the PCB 16 and the second region 20. Typically, a majority of the material within the isolation channel 24 may be removed, although a small portion of the isolation channel 24 may remain intact for safety purposes, as further discussed below.

The width of the isolation channel 24 may depend on a number of factors. Generally, any width that provides for the reliable removal of PCB 16 material within the isolation channel 24 is sufficient. Accordingly, the width of the isolation channel 24 may depend on the method of removal and on the thickness of the PCB 16. Material from the PCB 16 within the isolation channel 24 may be removed by, among other techniques, laser cutting or machine cutting. Laser cutting may involve using a high-power laser to melt, burn, or vaporize the PCB 16 material within the isolation channel 24. Utilizing laser cutting may allow for a narrow isolation channel 24. Machine cutting may involve a machine to drill or mill away the material in the isolation channel 24. With this technique, the width of the isolation channel 24 may depend on the thickness of the PCB 16, such that a thicker PCB 16 may require a wider isolation channel 24 and a thinner PCB 16 may allow for a narrower isolation channel 24. The width of the isolation channel 24 may also include a safety zone, wherein no components or traces 32 are placed, but where no PCB 16 material is removed. Thus, the isolation channel 24 is wider than the area of the PCB 16 that is to be removed to allow for errors or variations in the PCB removal or cutting method. Alternatively, the safety zone may be located outside of, but adjacent to, the isolation channel 24.

The distance from the perimeter of the footprint 22 to the isolation channel 24 may depend primarily on the number and the nature of the traces 32 and other components between the footprint 22 (and in turn the MEMS device 12) and the other components or terminals on the PCB 16, as well as the structure of the PCB 16. Generally, other components and more traces 32 and/or thicker traces 32 (such as for electrical power and ground) may require a greater distance from the footprint 22 to the isolation channel 24. Additionally, higher frequency signals may require special considerations for the traces 32 that lead to a greater distance. However, PCBs that include multiple conductive layers allow for traces 32 to be placed on more than one layer, such that traces 32 may be routed on top of one another on different layers. This multi-layer trace routing may lead to less area being required around the footprint 22 to route traces 32 from the footprint 22 to the rest of the PCB 16, which in turn may lead to a smaller distance from the perimeter of the footprint 22 to the isolation channel 24.

The bridge 26 generally provides a mechanical connection and support between the first regions 18 and the second region 20. In some embodiments, the bridge 26 may also provide electrical communication between the MEMS device 12 and the other components on the PCB 16 or other portions of a larger system. After the PCB 16 material within the isolation channel 24 is removed, the bridge 26 may be the only physical connection between the first region 18 and the rest of the PCB 16. The bridge 26 may include at least one PCB trace 32 that connects the footprint 22 to other components or terminals on the PCB 16. Typically, the bridge 26 includes one or more traces 32 from the footprint 22 to other components, wherein the traces 32 may include signals and electrical power and ground. In other embodiments, the bridge 26 may not include any traces 32, as discussed below.

The bridge 26 may be located adjacent to the first and second ends 36, 38 of the isolation channel 24, and generally between the first region 18 and the second region 20. In some embodiments the bridge 26 may be located near one of the corners of the footprint 22. In other embodiments, the bridge 26 may be located along one of the sides of the footprint 22. In various other embodiments of the system 10, there may be more than one bridge 26, which generally coincides with systems having more than one isolation channel 24. Typically, the plurality of bridges 20 are located between the ends of the isolation channels 18. For example, a system 10 may include two isolation channels 18 with bridges 20 between them located near opposing corners of the footprint 22. Alternatively, a system 10 may include two isolation channels 18 with bridges 20 between them located along opposing sides of the footprint 22.

The width of the bridge 26 may depend on factors such as the number of traces 32 from the footprint 22 to other components, the number of conductive layers of the PCB 16, and the physical characteristics of the PCB 16 including the first region 18. Generally, a larger number of traces 32 and/or traces 32 that are wider (for electrical power and ground) require a larger sized bridge 26. However, a larger number of conductive layers for the PCB 16 may lead to a smaller sized bridge 26 as traces 32 may be routed on top of one another on different layers. Furthermore, a thinner board or one that is made from less rigid material may require a larger bridge 26 than a thicker board or one that is made from stiffer material. In addition, a larger first region 18 may require a larger bridge 26 than a smaller first region 18.

In various other embodiments of the system 10, the bridge 26 may not include conductive traces 32. In such embodiments, various connectors may be utilized to provide electrical communication between devices on the first region 18 and other components on the PCB 16. For example, if a large number of conductors need to be connected to the first region 18, a flexible cable such as a flex strip may be connected between connectors on the first region 18 and on the PCB in the second region 20. These conductors would not then need to be included in the bridge 26, which allows for maximizing mechanical isolation by minimizing the width of the bridge 26. Other embodiments may use connectors to create the bridge 26 instead of a PCB 16 bridge. For example, a detachable first region 18 may be connected to the second region 20 via right-angle connectors in the first region 18 and the second region 20. A bridge 26 which is constructed with a connector rather than PCB 16 material may provide more mechanical isolation than a bridge 26 made of PCB 16 material.

Figure 3:
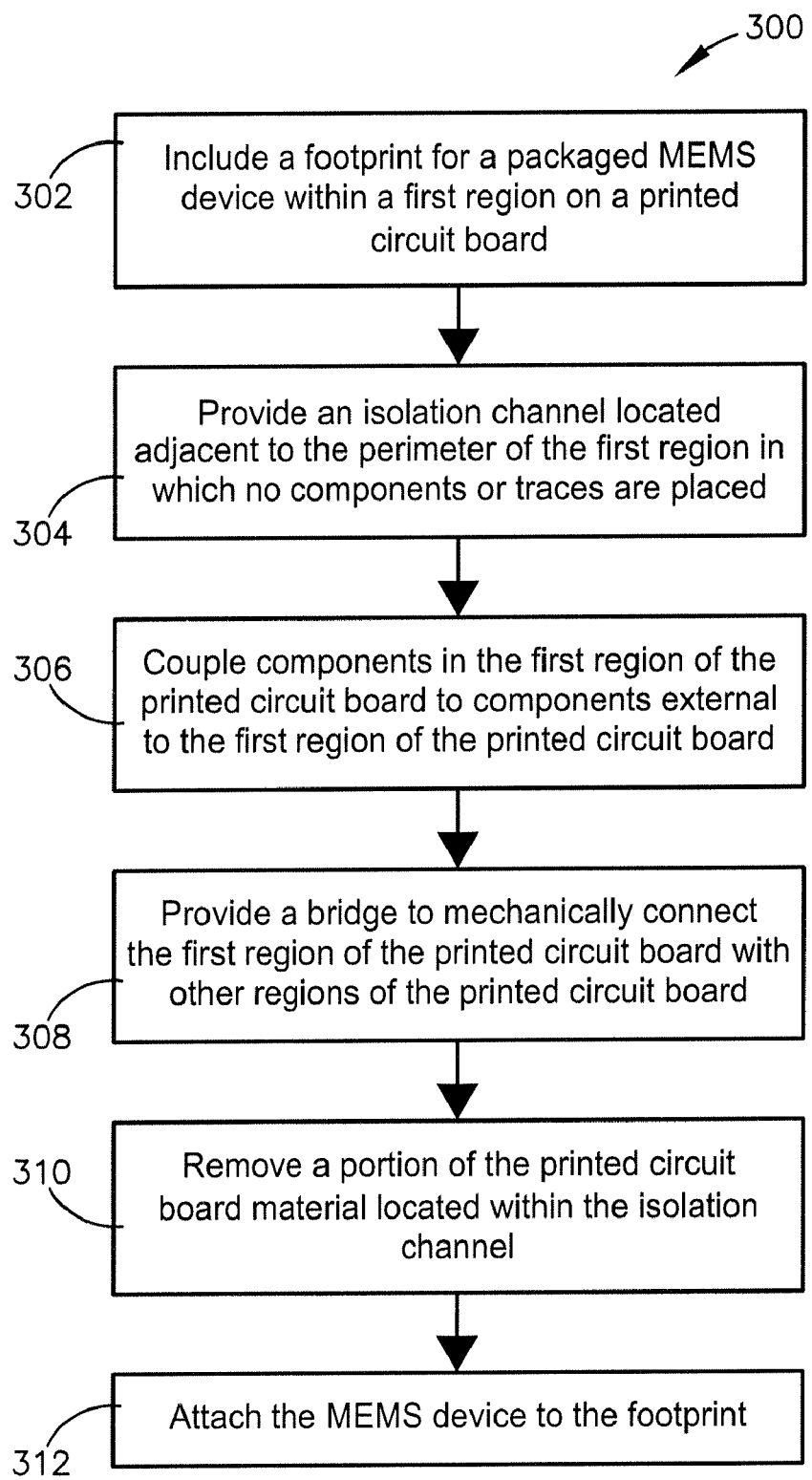
FIG. 3 is a flow diagram depicting some of the steps performed in a method of improving the performance of a packaged MEMS device implemented on a PCB.

An exemplary method 300 for improving the performance of a MEMS device 12 that is implemented on a PCB 16 is illustrated in FIG. 3. The steps as shown in FIG. 3 do not imply a particular order of execution. Some steps may be performed before, concurrently with, or simultaneously with other steps in contrast to what is shown in the figure.

In step 302, a footprint 22 is provided for a packaged MEMS device 12 within a first region 18 on a PCB 16, as shown in FIG. 1. The footprint 22 includes one or more conductive pads 30 or holes that correspond to one or more connectors 28 on the exterior of the package 14 for the MEMS device 12. The footprint 22 may be placed automatically or manually using CAD or EDA software tools.

In step 304, an isolation channel 24 is provided for the PCB 16 located adjacent to the perimeter of the first region 18 in which no components or traces 32 are placed. The isolation channel 24 may be generally elongated with a first end 36 and a second end 38. Generally, the isolation channel 24 substantially mechanically isolates at least the footprint 22 from PCB regions containing potential stress sources. The isolation channel 24 may be specified or created using CAD or EDA software tools.

In step 306, components within the first region 18 of the PCB 16 are coupled to components and other elements, such as terminals or external systems, that are outside of the first region 18. In various embodiments, electrically conductive traces 32 may be routed from the footprint 22 to the rest of the PCB 16 through the bridge 26. The traces 32 may be routed through the bridge 26 on one or more conductive layers of the PCB 16. The traces 32 may be routed either automatically or manually using CAD or EDA software tools.

In step 308, a bridge 26 is provided to mechanically connect the first region 18 to other regions of the PCB 16. In addition, the bridge 26 may receive electrically conductive traces 32 to couple the MEMS device 12 with the rest of the PCB 16. The bridge 26 may be located adjacent to the isolation channel 24—typically between the first end 36 and the second end 38 of the isolation channel 24. The size of the bridge 26 may depend upon the number of traces 32 that are to be received and/or the need for mechanical support of the first region 18.

In step 310, a portion of the PCB 16 material located within the isolation channel 24 is removed, as shown after removal in FIG. 2. The material may be removed by techniques such as laser cutting or machine cutting. Removal of the material generally provides mechanical isolation between the MEMS device 12 and the rest of the PCB 16.

In step 312, the MEMS device 12 is attached to the footprint 22. The package may be aligned to the footprint 22 either automatically by machine or manually by hand. The connectors 28 of the package 14 may then be soldered to the pads of the footprint 22 using automated heating and/or soldering equipment or manual equipment, such as soldering irons or solder guns.

The system 10 and methods disclosed herein have been directed toward mechanically isolating a packaged MEMS device 12 on a PCB 16. The system 10 and methods may also generally apply to any packaged electrical, electronic, electromechanical, electro-optical, optoelectronic, or similar device. Furthermore, the system 10 and methods may be applied to mechanically isolating an unpackaged MEMS device 12. Step 312 may include attaching the MEMS device 12 to the PCB 16 within the area of the footprint 22; wirebonding, or otherwise coupling, the inputs and outputs of the device to the pads of the footprint 22; and covering the MEMS device 12 and the footprint 22 with a protective shell or coating or the like.

EXAMPLE

To demonstrate the benefit of the system of the current invention, a packaged MEMS device 12 was implemented on a first PCB without the system and a second PCB with the system. The packaged MEMS device was a BMA150 accelerometer manufactured by Bosch Sensortech of Reutlingen, Germany. The first PCB included the packaged MEMS device 12 that was mounted on the first PCB using traditional techniques. The second PCB included the packaged MEMS device 12 that was implemented using the system 10 and method as disclosed herein. The second PCB included a single isolation channel 24 that surrounded at least 80% of the perimeter of the first region 18.

Figure 4:
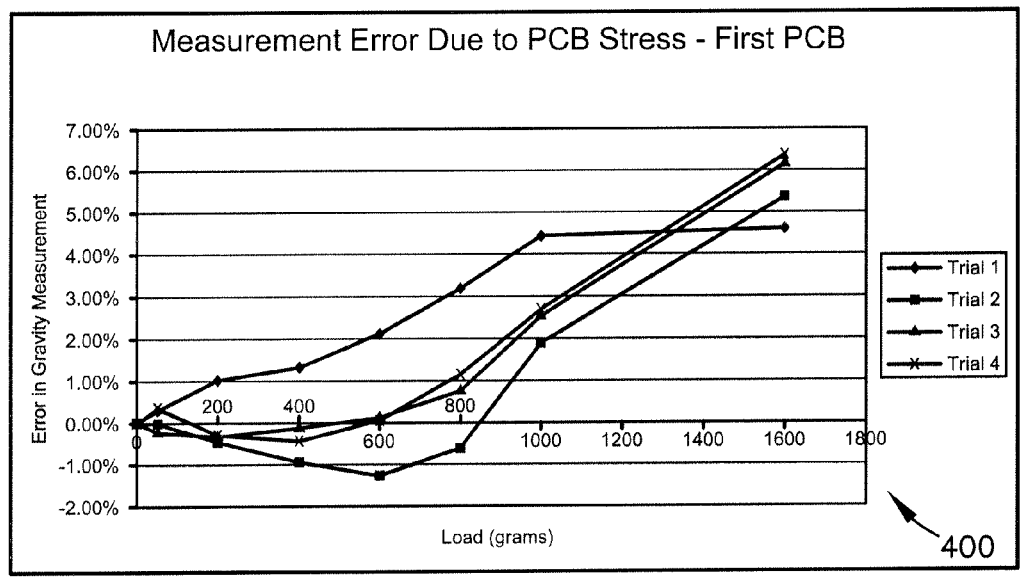
FIG. 4 is graph depicting the measurement error due to PCB stress of a MEMS accelerometer implemented on a PCB without the system of the current invention.
Figure 5:
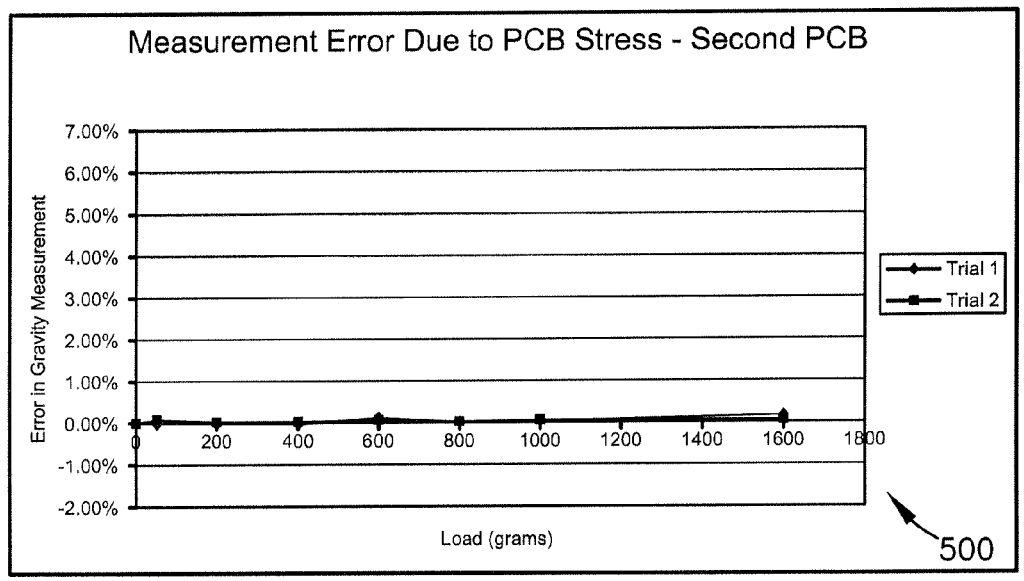
FIG. 5 is graph depicting the measurement error due to PCB stress of a MEMS accelerometer implemented on a PCB with the system.

For the first PCB and the second PCB, a load was suspended from each PCB with each PCB being supported only on opposing ends. The mass of the load was varied from 0 grams to 1600 grams and the gravity acceleration measurement from the accelerometer was recorded and compared with the expected measurement. The percent error in the measurement was recorded and plotted for the varying load during four trials for the first PCB and two trials for the second PCB. The results for the first PCB are shown in graph 400 of FIG. 4, and the results for the second PCB are shown in graph 500 of FIG. 5. As can be seen, the error in measurement for the first PCB, utilizing traditional techniques, increases roughly exponentially with an increasing load. However, the second PCB, which utilizes the system of embodiments of the current invention, possesses a very small error and the error remains small even as the load increases.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A system for improving the performance of a microelectromechanical systems (MEMS) device implemented on a printed circuit board, the system comprising:
   a footprint to receive the MEMS device within a first printed circuit board region;
   at least one isolation channel passing through a portion of the printed circuit board to mechanically isolate the first printed circuit board region from a second non-overlapping printed circuit board region, the at least one isolation channel surrounding at least a portion of one of the first or second regions; and
   at least one bridge located adjacent to the at least one isolation channel.

2. The system of claim 1, further including at least one electrical conductor to couple at least one component within the first printed circuit board region to at least one component within the second printed circuit board region.

3. The system of claim 2, wherein the at least one electrical conductor is an electrically conductive trace routed through the at least one bridge.

4. The system of claim 1, wherein the at least one bridge mechanically connects the first and the second regions of the printed circuit board.

5. The system of claim 1, wherein the at least one isolation channel surrounds at least 75% of the perimeter of one of the first or second regions.

6. The system of claim 1, wherein the at least one isolation channel surrounds at least a portion of every side of one of the first or second regions.

7. The system of claim 1, wherein the at least one isolation channel is elongated and is oriented generally parallel to the perimeter of one of the first or second regions.

8. The system of claim 1, further including the MEMS device, wherein the MEMS device is housed within a package that is operable to attach to the footprint.

9. The system of claim 8, wherein the MEMS device is one of an accelerometer or a pressure sensor.

10. The system of claim 8, wherein the package is a plastic package.

* * * * *